US007206558B2

United States Patent
Walker et al.

(10) Patent No.: US 7,206,558 B2
(45) Date of Patent: Apr. 17, 2007

(54) TECHNIQUE FOR DETERMINING A TUNING FREQUENCY OF AN AUDIO RECEIVER

(75) Inventors: Glenn A. Walker, Greentown, IN (US); Peter A. Moody, Fishers, IN (US)

(73) Assignee: Delphi Technologies, Inc., Troy, MI (US)

( * ) Notice: Subject to any disclaimer, the term of this patent is extended or adjusted under 35 U.S.C. 154(b) by 362 days.

(21) Appl. No.: 10/740,332

(22) Filed: Dec. 18, 2003

(65) Prior Publication Data
US 2005/0136870 A1 Jun. 23, 2005

(51) Int. Cl.
*H04B 1/18* (2006.01)
(52) U.S. Cl. .................. 455/150.1; 455/184.1
(58) Field of Classification Search ............ 455/150.2, 455/179.1, 182.1, 182.3, 185.1, 188.1, 192.1, 455/192.2, 192.3, 556.1, 557, 184.1, 344, 455/345, 150.1
See application file for complete search history.

(56) References Cited

U.S. PATENT DOCUMENTS

| 5,404,161 | A | * | 4/1995 | Douglass et al. ............. 725/15 |
| 5,438,688 | A | * | 8/1995 | Masaki .................... 455/161.2 |
| RE37,131 | E | * | 4/2001 | Mankovitz ................. 455/66.1 |
| 6,252,635 | B1 | * | 6/2001 | Vandeputte ................. 348/731 |
| 6,704,553 | B1 | * | 3/2004 | Eubanks ................... 455/186.1 |

* cited by examiner

*Primary Examiner*—Quochien B. Vuong
*Assistant Examiner*—Christian A. Hannon
(74) *Attorney, Agent, or Firm*—Jimmy L. Funke

(57) ABSTRACT

A technique for determining a tuning frequency of an audio receiver includes interrupting a received radio frequency (RF) signal at an input of the audio receiver. Next, a modulated audio signal is injected into the input of the audio receiver. Then, it is determined whether the demodulated audio signal is present at an output of the audio receiver. If not, the frequency of the modulated audio signal is changed until the demodulated audio signal is detected at the output of the audio receiver.

11 Claims, 3 Drawing Sheets

TECHNIQUE FOR DETERMINING A TUNING FREQUENCY OF AN AUDIO RECEIVER

TECHNICAL FIELD

The present invention is generally directed to an audio receiver and, more specifically, determining a tuning frequency of an audio receiver.

BACKGROUND OF THE INVENTION

Various commercially available after-market devices have been designed to intercept radio frequency (RF) transmissions at an input of an RF receiver and inject a different transmission signal into the RF receiver. In general, these devices use existing RF receivers, e.g. frequency modulation (FM) receivers, to implement additional audio functions, e.g., mobile phones, satellite digital audio radio systems (SDARS) and compact disc (CD) players. Many of these devices detect a local oscillator (LO) frequency of an FM receiver to determine a current channel of the receiver (tuner). In general, such after-market devices have been inserted between the receiver and its associated antenna.

These devices have typically relied on the presumption that FM receivers use the same tuner design or the same intermediate frequencies. Such devices work relatively well with FM receivers that have sufficient LO leakage such that the intermediate frequencies can be detected. However, there are many FM receivers that suppress LO leakage and/or use different tuner architectures and, in these situations, the currently available after-market devices do not function adequately. In receivers that suppress LO leakage, an operator of the receiver has been required to tune to a fixed frequency of operation for the after-market device. Unfortunately, this eliminates any ability for an added device to interrupt the current receiver channel, unless a user is on that channel.

What is needed is a device that, when placed between a radio frequency (RF) receiver and its associated antenna, determines a current channel of the receiver.

SUMMARY OF THE INVENTION

One embodiment of the present invention is directed to a technique for determining a tuning frequency of an audio receiver. Initially, a received radio frequency (RF) signal at an input of an audio receiver is interrupted. Next, a modulated audio signal is injected into the input of the audio receiver. Then, it is determined whether a demodulated audio signal that corresponds to the modulated audio signal is present at the output of the audio receiver. If not, the frequency of the modulated audio signal is changed until the demodulated audio signal is detected at the output of the audio receiver.

According to another embodiment of the present invention, the modulated audio signal may be initially injected at a last known channel of the audio receiver. According to still another embodiment of the present invention, the modulated audio signal is one of a tone, a sequence of tones, a set of tones and a pseudo random noise (PRN). According to yet another embodiment of the present invention, the received RF signals are interrupted responsive to an audio source. In another embodiment of the present invention, the modulated audio signal is one of an amplitude modulated (AM) signal and a frequency modulated (FM) signal.

According to various embodiments of the present invention, audio content from an audio source is provided at the output of the audio receiver when the demodulated audio signal is present at the output of the audio receiver, thus, indicating that the modulated audio signal is tuned to the current channel of the audio receiver.

According to a different embodiment of the present invention, a modulated audio signal is superimposed on a received radio frequency (RF) signal at an input of an audio receiver. Next, it is determined whether a demodulated audio signal that corresponds to the modulated audio signal is present at the output of the audio receiver. If the audio signal is not present at the output of the audio receiver, the frequency of the modulated audio signal is changed.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

According to one embodiment of the present invention, an audio subsystem is implemented that injects an audio signal between a radio frequency receiver and its associated antenna. When commanded, via for example an additional audio source, the subsystem interrupts a received RF signal and injects an audio signal at the last known frequency, which statistically speeds up tuning, or may step through a sequence of frequencies. The subsystem then looks for the expected audio signal at the output of the audio receiver, e.g., at the speakers of the audio system. If the expected audio signal is not present at the output of the audio receiver, the system changes to the next frequency and repeats until the correct frequency is found. The subsystem may use a microphone (or other device) to detect the audio signal at the output of the audio receiver. It should be appreciated that the known audio signal may be a tone, a sequence of tones, a set of tones, a pseudo random noise (PRN) or other detectable input.

According to another embodiment of the present invention, an audio subsystem continually monitors and tracks a current radio frequency (RF) channel and superimposes an audio signal on top of received RF signals. In general, the superimposed audio signal is low in power, as compared to the received RF signal currently on the channel, such that a listener does not detect the intrusion but the audio signal is detectable at the output of the audio receiver. As with the above-described technique, a known pseudo random noise (PRN) may be superimposed that is unnoticeable to a user, but detectable. For example, if the PRN sequence is long enough, the superimposed signal may readily be detectable. As with the above technique, the subsystem may, in general, step through a series of channels until the audio signal is detected at the output of the audio receiver.

Figure 1:
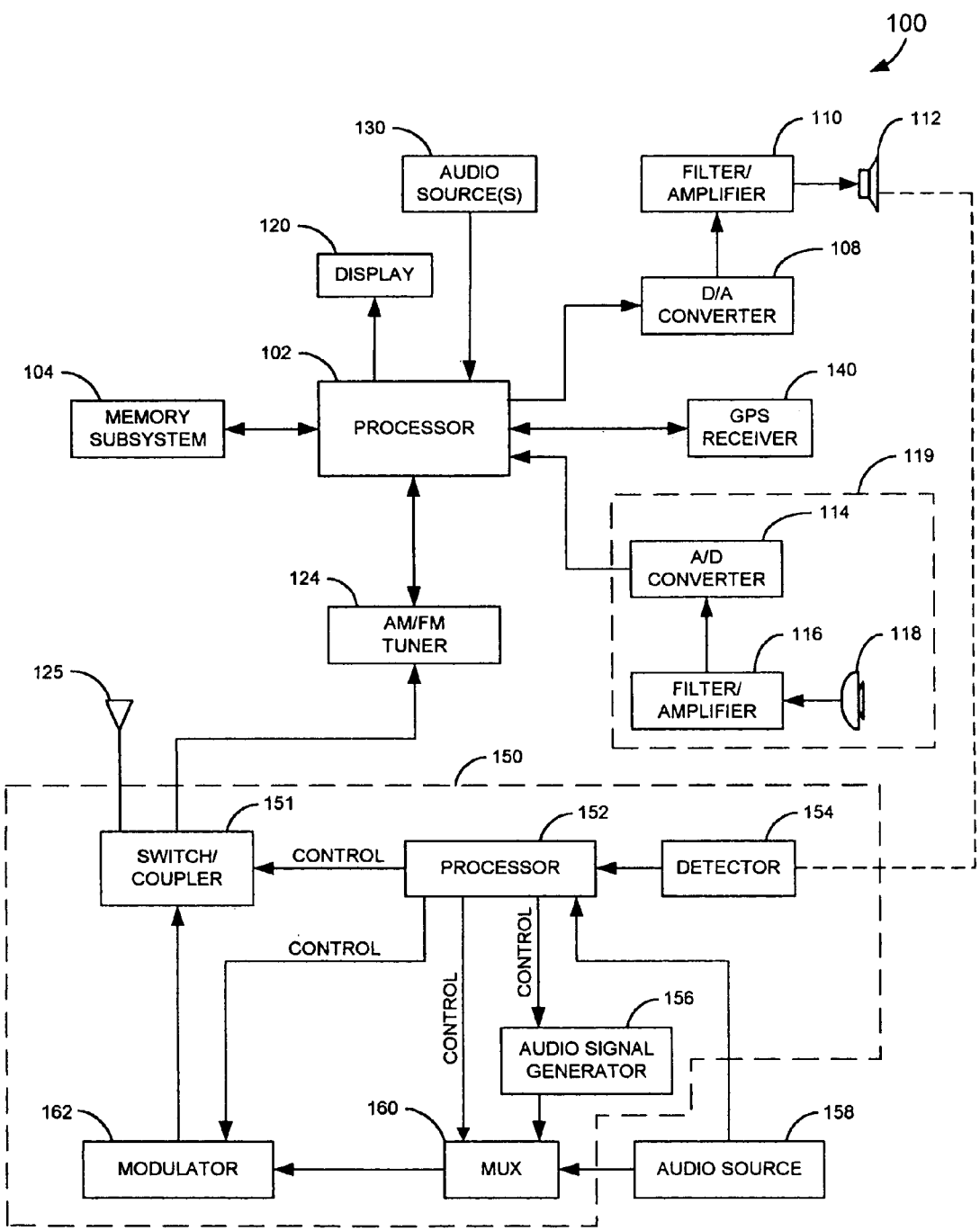
FIG. 1 is an electrical block diagram of an exemplary audio system and an audio subsystem for implementing the present invention.

With reference to FIG. 1, an exemplary audio system 100 includes a processor 102 that is coupled to a memory subsystem 104, a display 120, an AM/FM tuner 124 and a plurality of audio sources 130. The processor 102 controls audio content provided to a listener via a the speaker 112, and may also supply various information to a user, via the display 120 and/or the speaker 112. As used herein, the term processor may include a general purpose processor, a microcontroller (i.e., an execution unit with memory, etc., integrated within a single integrated circuit), an application specific integrated circuit (ASIC), a programmable logic device (PLD) or a digital signal processor (DSP). The memory subsystem 104 includes an application appropriate amount of memory (e.g., volatile and non-volatile memory), which provides storage for various routines that are used to tune the tuner AM/FM 124 and may also provide a storage area for one or more speech recognition applications.

As is also shown in FIG. 1, an audio input device 118 (e.g., a microphone) is coupled to a filter/amplifier module 116. The filter/amplifier module 116 filters and amplifies the voice input provided by a user through the audio input device 118. The filter/amplifier module 116 is also coupled to an analog-to-digital (A/D) converter 114, which digitizes the voice input from the user and supplies the digitized voice to the processor 102 which may execute a speech recognition application, which causes the voice input to be compared to system recognized commands. In general, the audio input device 118, the filter/amplifier module 116 and the A/D converter 114 form a voice input circuit 119.

The processor 102 may execute various routines in determining whether the voice input corresponds to a system recognized command and/or a specific operator. The processor 102 may also cause an appropriate voice output to be provided to the user through the speaker or audio output device 112. The synthesized voice output is provided by the processor 102 to a digital-to-analog (D/A) converter 108. The D/A converter 108 is coupled to a filter/amplifier section 110, which amplifies and filters the analog voice output. The amplified and filtered voice output is then provided to audio output device 112 (e.g., a speaker). The processor 102 is also coupled to a global position system (GPS) receiver 140, which allows the system 100 to determine the location of the receiver 140 and its associated motor vehicle.

An audio subsystem 150 allows various after-market devices, e.g., mobile phones, satellite digital audio radio systems (SDARS) and compact disc (CD) players, to utilize the audio system 100 installed within a motor vehicle. As is shown, an antenna 125, associated with the motor vehicle, is coupled to a switch/coupler 151, whose output is coupled to an input of the tuner 124. The switch/coupler 151 may be implemented as either a switch or a coupler and, as discussed further below, the modulated audio output provided from a modulator 162 replaces the RF signal received by the antenna 125 when the switch/coupler 151 is a switch. When the switch/coupler 151 is a coupler, the modulated audio output provided from the modulator 162 is superimposed on the signal received via the antenna 125. It should be appreciated that, in either case, the signal provided through the modulator 162 is only provided at the output of the audio system 100 when the signal provided from the modulator 162 is modulated at a frequency that corresponds to the current channel of the tuner 124.

The subsystem 150 also includes a processor 152 that is coupled to a detector 154, the modulator 162, a multiplexer 160, an audio signal generator 156 and an external audio source 158. When the switch/coupler 151 is implemented as a switch, the processor 152 controls whether the output from the antenna 125 or the modulator 162 is provided to the input of the tuner 124. When the switch/coupler 151 is implemented as a coupler, a separate control line is not required (from the processor 152 to the coupler) as the signal provided by the modulator 162 is superimposed on the RF signal received via the antenna 125.

As is shown in FIG. 1, the detector (e.g., a microphone) 154 is coupled to the processor 152 and provides an indication to the processor 152 whether a signal provided via the modulator 162 is present at the output, i.e., at the speaker 112, of the audio system 100. If the signal is not detected via the detector 154, the processor 152 controls the modulator 162 to step to a next frequency or next channel. The processor 152 controls the multiplexer 160 to provide either a signal from the audio signal generator 156 or the external audio source 158. The signal from the audio signal generator 156 may take various forms, such as a tone, a sequence of tones, a set of tones or a pseudo random noise (PRN), which is utilized by the processor 152 to determine whether the modulator 162 is tuned to an appropriate frequency.

When the detector 154 indicates that the signal provided by the audio signal generator 156 is present at the output of the audio system 100, the processor 152 controls the multiplexer 160 to select an audio signal from the audio source 158. The output from the audio source 158 is then modulated by the modulator 162 before being provided to an input of the tuner 124, via the switch/coupler 151, and ultimately to a listener, via the speaker 112.

As is discussed above, when the switch/coupler 151 is implemented as a switch, the processor 152 causes the received radio frequency (RF) signal at the input of the audio receiver (i.e., the tuner 124) to be interrupted and injects a modulated audio signal provided by the audio signal generator 156 at the input of the audio receiver (tuner 124). Upon determining that a demodulated audio signal that corresponds to the modulated audio signal is not present at the output of the tuner 124, the processor 152 changes the frequency of the modulated audio signal provided by the audio signal generator 156. According to one embodiment of the present invention, the modulated audio signal is initially provided at a last known radio frequency channel.

Figure 2:
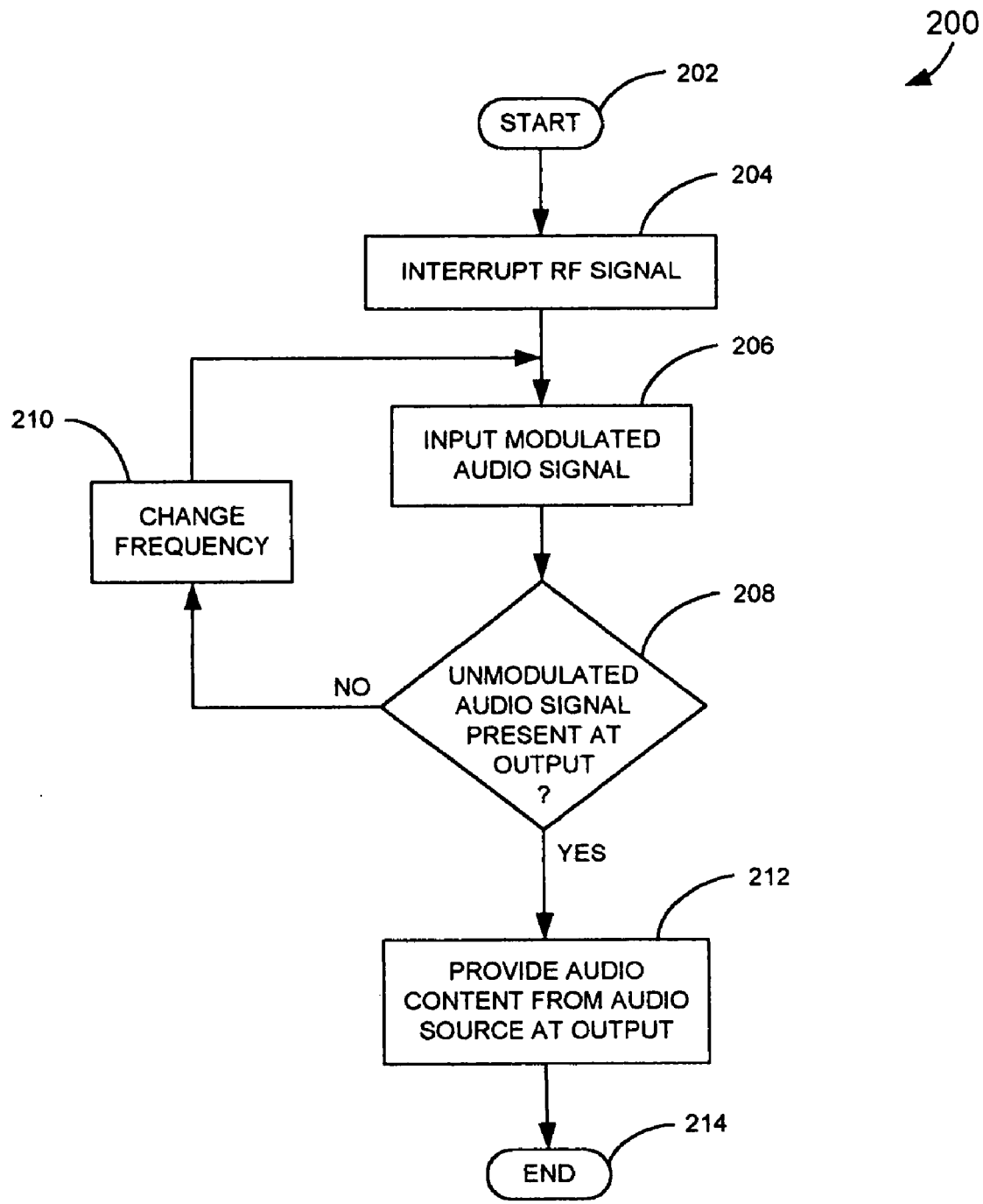
FIG. 2 is a flow chart of an exemplary routine for implementing one embodiment of the present invention.

With reference to FIG. 2, a routine 200 is illustrated, which is implemented by the processor 152 in determining a tuning frequency of the tuner 124. Initially, in step 202, the routine 200 is initiated, at-which point control transfers to step 204, where the processor 152 causes the RF signal received via the antenna 125 to be interrupted by controlling the switch within the switch/coupler 151. Next, in step 206, the processor 152, by controlling the modulator 162, the multiplexer 160 and the audio signal generator 156, causes an injected modulated audio signal to be provided to an input of the tuner 124. Then, in decision step 208, the processor 152 determines whether a demodulated audio signal that corresponds to the modulated audio signal is present at the output of the tuner 124, e.g., at the speaker 112.

As discussed above, the processor 152 determines whether the demodulated audio signal is present at the output of the tuner 124 by examining a signal received by the detector 154. When the processor 152 determines that the demodulated audio signal is present at the output of the tuner 124, the processor 152 causes the multiplexer 160 to switch to provide audio content from the audio source 158 in step 212. However, when the demodulated audio signal is not present at the output of the tuner 124 in step 208, the processor 152 causes the modulator 162 to change frequency in step 210, at which point control is transferred to step 206. In step 208, when the demodulated audio signal is present at the output of the tuner 124, control transfers to step 212 where audio content is provided from the audio source 158, before terminating the routine 200 in step 214.

Figure 3:
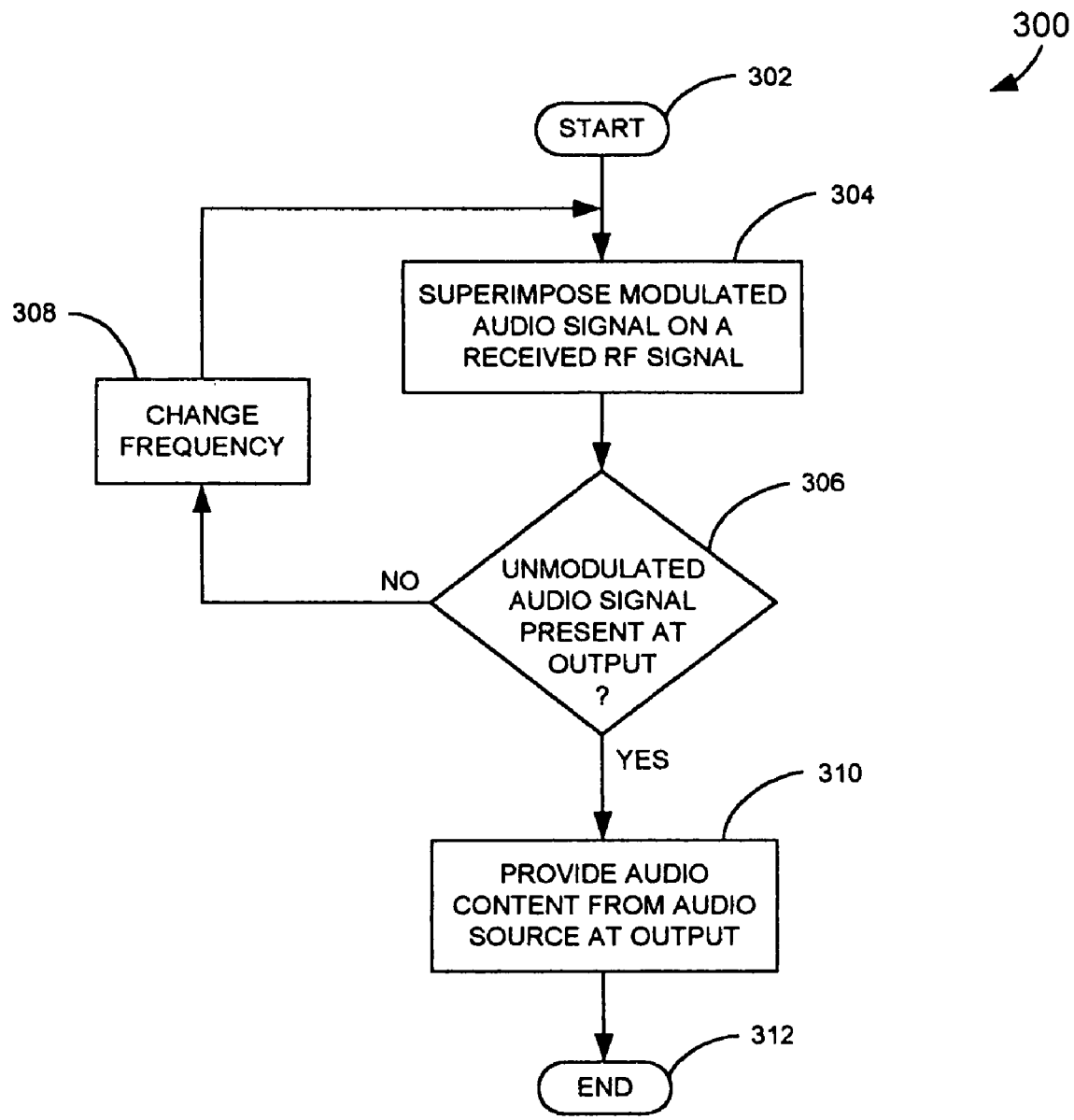
FIG. 3 is a flow chart of an exemplary routine for implementing another embodiment of the present invention.

With reference to FIG. 3, according to another embodiment of the present invention, the processor 152 implements a routine 300, which is initiated in step 302. Next, in step 304, the processor 152 controls the modulator 162 to cause a modulated audio signal (provided by the audio signal generator 156 via the multiplexer 160) to be superimposed on the RF signal received via the antenna 125. Next, in decision step 306, the processor 152 determines whether a demodulated audio signal that corresponds to the modulated audio signal is present at the output of the tuner 124. As is discussed above, the processor 152 determines whether the audio signal is present at the output of the tuner 124 by examining an output signal provided by the detector 154.

In step 306, when the processor 152 does not detect the demodulated audio signal at the output of the audio system 100, control transfers to step 308. In step 308, the processor 152 controls the modulator 162 to change the modulation frequency, at which point control transfers to step 304. In decision step 306, when the demodulated audio signal is present at the output of the tuner 124, control transfers to step 310 and the processor 152 controls the multiplexer 160 to couple the output from the audio source 158 to the modulator 162, which is then provided via a coupler (associated with the switch/coupler 151) to the input of the tuner 124. Thus, the processor 152 controls the audio source 158, the multiplexer 160 and the modulator 162 to provide audio content from the audio source 158 at the output of the audio system 100 before terminating the routine 300 in step 312.

Accordingly, a number of techniques have been described herein that allow an after-market audio source, installed within a motor vehicle, to utilize a radio frequency (RF) receiver installed in the motor vehicle to provide audio content from the audio source to an occupant of the motor vehicle.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A method of employing an audio subsystem for determining a tuning frequency of an audio receiver, wherein the audio subsystem comprises an audio signal generator for providing an audio signal, a detector for detecting a demodulated audio signal provided at an output of the audio receiver, a modulator coupled to the audio signal generator, the modulator providing a modulated audio signal that corresponds to the audio signal provided by the audio signal generator, and a processor coupled to the audio signal generator, the detector and the modulator, said method comprising the steps of:
   interrupting received radio frequency (RF) signals at an input of an audio receiver;
   injecting a modulated audio signal at the input of the audio receiver;
   determining whether a demodulated audio signal that corresponds to the modulated audio signal is present at an output of the audio receiver; and
   changing a frequency of the modulated audio signal when the demodulated audio signal is not present at the output of the audio receiver.

2. The method of claim 1, wherein the modulated audio signal is initially injected at a last known channel of the audio receiver.

3. The method of claim 1, wherein the modulated audio signal is one of a tone, a sequence of tones, a set of tones and a pseudo random noise (PRN).

4. The method of claim 1, wherein the received RF signals are interrupted responsive to an audio source.

5. The method of claim 1, wherein the modulated audio signal is one of an amplitude modulated (AM) signal and a frequency modulated (FM) signal.

6. The method of claim 1, further comprising the step of:
   providing audio content from an audio source at the output of the audio receiver when the demodulated audio signal is present at the output of the audio receiver.

7. The method of claim 6, wherein the audio source is one of a mobile telephone, a satellite digital audio receiver (SDAR) system and a compact disk (CD) player.

8. An audio subsystem, comprising:
   an audio signal generator for providing an audio signal;
   a detector for detecting a demodulated audio signal provided at an output of an audio receiver;
   a modulator coupled to the audio signal generator, the modulator providing a modulated audio signal that corresponds to the audio signal provided by the audio signal generator; and
   a processor coupled to the audio signal generator, the detector and the modulator, wherein the processor is configured to execute code for causing the processor to perform the steps of:
      interrupting received radio frequency (RF) signals at an input of the audio receiver;
      injecting the modulated audio signal at the input of the audio receiver;
      determining whether the demodulated audio signal is present at the output of the audio receiver, wherein the demodulated audio signal corresponds to the modulated audio signal; and
      changing a frequency of the modulated audio signal when the demodulated audio signal is not present at the output of the audio receiver.

9. The subsystem of claim 8, wherein the modulated audio signal is initially injected at a last known channel of the audio receiver.

10. The subsystem of claim 8, wherein the audio signal provided by the audio signal generator is one of a tone, a sequence of tones, a set of tones and a pseudo random noise (PRN).

11. The subsystem of claim 8, wherein the processor is configured to execute additional code that causes the processor to perform the addition step of:
   providing audio content from an audio source at the output of the audio receiver when the demodulated audio signal is present at the output of the audio receiver.

* * * * *